United States Patent [19]

Robitaille

[11] Patent Number: 5,051,732
[45] Date of Patent: Sep. 24, 1991

[54] POWER OUTLET GROUND INTEGRITY AND WRISTSTRAP MONITOR CIRCUIT

[75] Inventor: James M. Robitaille, Cleveland, Ohio

[73] Assignee: Ericson Manufacturing Company, Willoughby, Ohio

[21] Appl. No.: 239,198

[22] Filed: Aug. 29, 1988

[51] Int. Cl.$^5$ .......................................... G08B 21/00
[52] U.S. Cl. .................................. 340/650; 340/656; 324/510
[58] Field of Search ...................... 340/649, 650, 656; 324/509, 510

[56] References Cited

U.S. PATENT DOCUMENTS

| | | | |
|---|---|---|---|
| 3,783,340 | 1/1974 | Becker | 340/650 |
| 3,784,842 | 1/1974 | Kremer | 340/650 |
| 3,836,844 | 9/1974 | Prugh | 324/510 |
| 3,868,566 | 2/1975 | Parsons et al. | 324/510 |
| 4,506,260 | 3/1985 | Woodruff et al. | 340/649 |
| 4,558,309 | 12/1985 | Antonevich | 324/509 |
| 4,638,399 | 1/1987 | Maroney et al. | 324/509 |
| 4,649,374 | 3/1987 | Hoigaard | 340/649 |
| 4,710,751 | 12/1987 | Webster | 340/650 |
| 4,785,294 | 11/1988 | Campbell | 340/649 |
| 4,800,374 | 1/1989 | Jacobson | 340/649 |

Primary Examiner—Joseph A. Orsino
Assistant Examiner—Jill Jackson
Attorney, Agent, or Firm—Jones, Day, Reavis & Pogue

[57] ABSTRACT

A plug-mounted wriststrap detector and ground monitor includes hot, neutral and ground input terminals which are connected to corresponding terminals of a power outlet when the circuit is plugged in. A jack is provided to plug a wriststrap into the circuit to provide electrostatic protection to the user. Means are provided to detect that the user is wearing the wriststrap and that the wriststrap is properly connected to the circuit as a function of whether an a.c. signal of sufficient amplitude is detected coupled to the circuit by the wriststrap and/or user. Lamps and an audible alarm warn the user if the wriststrap is not properly connected. A precision ground integrity circuit is provided to detect whether an unsafe ground condition exists and to alert the user accordingly. The ground integrity circuit uses a constant current source and voltage comparator to determine that the ground impedance does not exceed a predetermined limit.

18 Claims, 1 Drawing Sheet

POWER OUTLET GROUND INTEGRITY AND WRISTSTRAP MONITOR CIRCUIT

BACKGROUND OF THE INVENTION

The invention relates to ground fault detectors and static discharge wriststrap monitors.

Along with the ever expanding utilization of electrostatic sensitive electronic components and assemblies is the need to protect such devices during handling and use. One of the more common techniques is for the person handling such devices to wear a conductive wriststrap that is connected to earth ground. Also, grounded workbenches, tables and the like are commonly used. Such work areas typically include a conductive surface made of carbon impregnated foam rubber or plastic that is connected to earth ground.

Since a wriststrap essentially tethers a user to a specific location, it is often desirable to provide a wriststrap that can be grounded through a conventional three-plug power outlet or any outlet that provides an earth ground return line. This provides the user increased mobility and avoids the need to work in only one location.

Power outlets, however, can be and sometimes are miswired. For example, the hot and neutral or ground lines may be reversed, or the earth ground connection may be of high resistance or even completely open. Such conditions are not only hazardous to someone using the outlet, but also prevent a true ground on the wriststrap thereby defeating the electrostatic protection the wriststrap would otherwise provide.

SUMMARY OF THE INVENTION

The present invention provides circuitry which monitors ground integrity and wriststrap continuity and provides a visual and audible alarm when a fault is detected. The circuitry can be conveniently mounted in a small plug-in unit that is easily transported from outlet to outlet. A jack is provided for a wriststrap plug. The circuitry detects various wiring errors in the outlet, as well as the absence or presence of line voltage and earth ground. The circuitry also detects whether a surface such as that of a workbench is properly grounded. The ground integrity circuit is high precision and adjustable to permit a range of selectable ground impedance values.

These and other aspects and advantages of the present invention will be explained and understood from the following specification and accompanying drawings.

DETAILED DESCRIPTION OF THE INVENTION AND PREFERRED EMBODIMENT THEREOF

Figure 1:
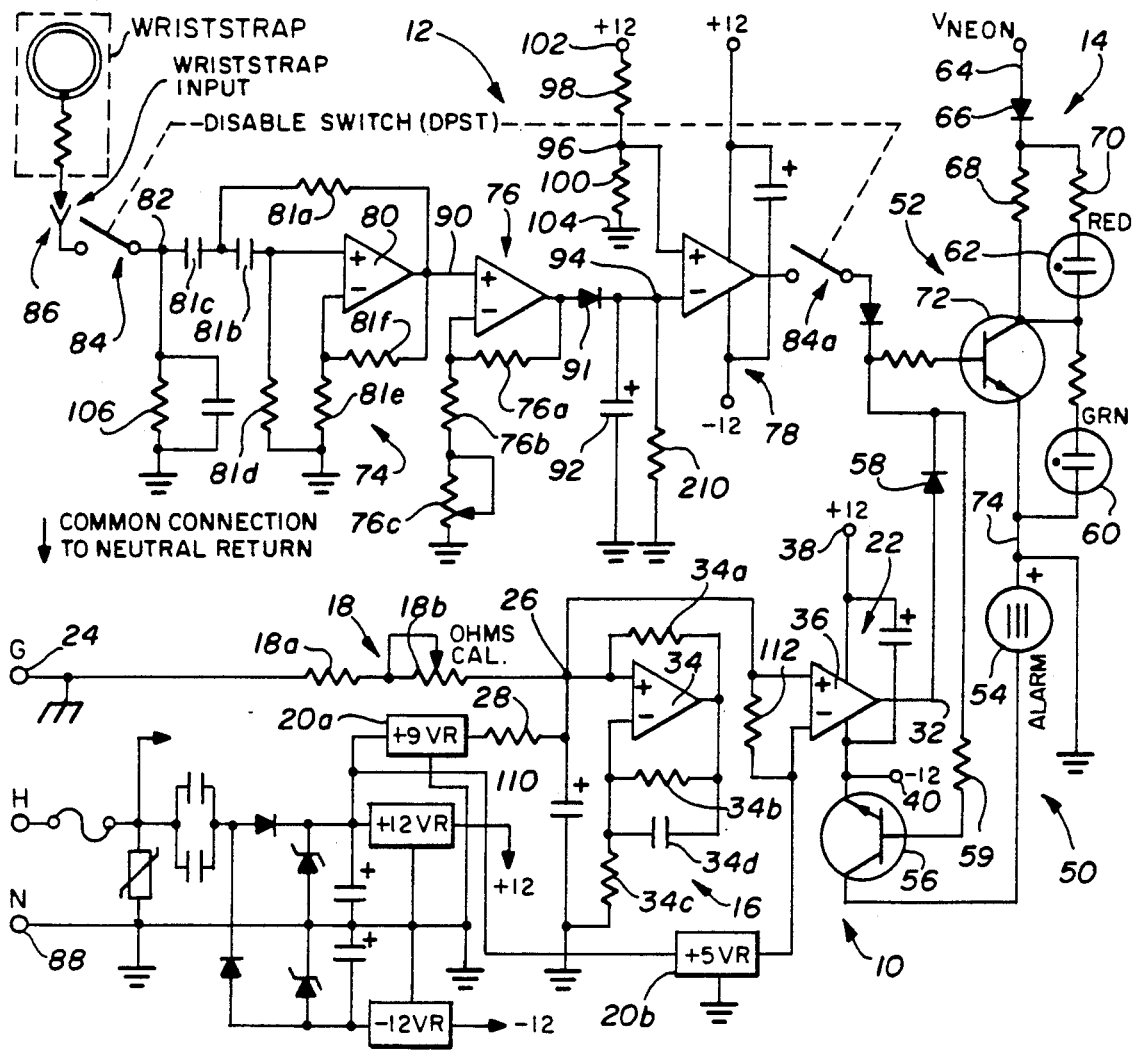
FIG. 1 is an electrical schematic diagram of the preferred embodiment of the invention.
Figure 2:
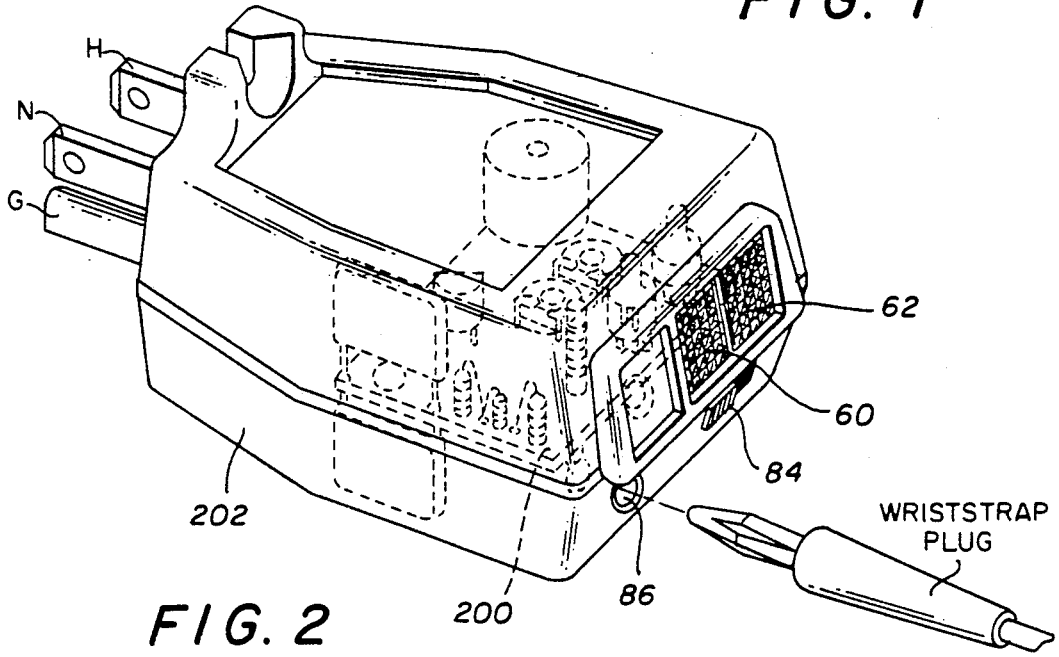
FIG. 2 is a simplified perspective drawing of a plug-in module suitable for use with a circuit such as in FIG. 1.

Referring to FIG. 1, the present invention contemplates circuitry having a ground integrity circuit 10, a wriststrap detector circuit 12, and an output display circuit 14. The circuitry includes three terminals designated Hot, Neutral and Ground which are connected to prongs for a conventional outlet plug (FIG. 2).

The ground integrity circuit 10 includes a constant current source circuit 16, an adjustable resistance 18, a pair of stable reference voltage sources 20a and 20b, and a differential comparator circuit 22.

The general operation of the ground integrity circuit 10 is as follows. The adjustable resistance 18 is connected in series between the ground input terminal 24 and the constant current source 16 which is referenced to the neutral return. A summing node 26, therefore, is at a voltage that is determined by the amount of current supplied by the current source 16, the reference voltage 20a connected to the node 26 by a resistor 28, and the effective resistance to earth ground through the ground terminal 24. The node 26 is connected to one of the inputs of the comparator 22. The comparator 22 compares the node 26 voltage level with the reference voltage 20b and produces an output voltage on conductor 32 that is a function of whether the node 26 voltage is above or below the reference voltage 20b.

The constant current source 16 is realized by an operational amplifier 34 configured in a conventional manner to provide a stable and constant source of current at the summing node 26. This current supply is independent of the effective ground resistance through the ground terminal 24. As shown in FIG. 1 the circuit 16 supplies about 100 microamps of current.

The comparator circuit 22 is also embodied in an operational amplifier 36 configured as a differential input comparator with open loop gain. The reference voltage 20b is selected at +5 volts (using a conventional dc voltage regulator) in the preferred embodiment and is connected to the inverting input of the op-amp 36. The output of the comparator will be a voltage near the positive power supply 38 of the comparator op-amp 36 whenever the voltage at node 26 is greater than +5 volts. When the voltage at node 26 is less than +5 volts the output of the comparator is at a voltage near the negative power supply 40 at the comparator op-amp.

The adjustable resistance 18 is set to provide +5 volts or more at the summing node 26 when the ground input terminal has a maximum effective resistance deemed to be acceptable for a given type of power outlet.

Thus, assume the ground terminal 24 of the power outlet is at true earth ground. After the resistance 18 is set, the voltage at node 26 will be something less than +5 volts and the comparator 22 output will be negative. As the effective resistance of the ground terminal 24 increases, however, due to improper wiring or poor electrical continuity, the voltage at node 26 increases proportionately. Whenever the effective resistance of the ground terminal exceeds the preadjusted limit set by the resistance 18, the summing node 26 voltage exceeds the comparator reference voltage 20b and the output of the comparator switches to a positive voltage.

The resistance 18 may include a fixed resistor 18a in series with an adjustable potentiometer 18b. The fixed resistor approximately sets the ground resistance trip point and the potentiometer is used for fine adjustment. As a typical example, the resistance 18 can be adjusted so that the comparator trips when the ground terminal resistance exceeds 100 ohms. Alternatively, a low resistance requirement could be imposed to trip the comparator when the ground terminal impedance exceeds only 2 ohms. Likewise, a less restrictive setting could make the comparator trip at a ground terminal resistance of 1000 ohms. The parameters can be adjusted by a designer to allow the ground integrity circuit 10 to detect an excessive ground terminal impedance of almost any value. The stable constant current source 16 and comparator circuit 22 allow for very precise control over the resistance trip point detected at the ground terminal. Of course, the reference voltages 20a and 20b should be relatively stable. These voltage supplies can be provided in a known manner by use of D.C. voltage regulators operating from a main power supply 30.

The output display circuit 14 includes an audible alarm circuit 50 and a lamp display 52. The alarm 50 includes a conventional D.C. buzzer type alarm 54 in series with a switching transistor 56 and the negative D.C. supply 40. Whenever the output voltage of the comparator circuit 22 on conductor 32 is high, base drive current is supplied through a forward biased diode 58 and resistor 59, so that the switching transistor 56 is turned on and activates the buzzer 54. When the comparator 36 output is low, diode 58 is reverse biased so that the switching transistor is off and the buzzer is off.

The lamp circuit 52 includes a green or "circuit ok" lamp 60 and a red or "circuit not ok" lamp 62. Power to the lamps (Vneon) is provided from a conductor 64 connected to the "hot" input terminal or line voltage of the power outlet. A diode 66 half rectifies the line voltage thus providing a pulsed power supply to the lamps 60,62. Two resistors 68,70 respectively connect the pulsed voltage supply to the lamps 60,62. A second switching transistor 72 is connected in parallel across the "circuit ok" lamp 60.

The switching transistor 72 is off whenever the comparator 36 output voltage is low, and is on whenever the comparator 36 output voltage is high, in a manner similar to the switching transistor 56 previously described.

The supply resistor 68 is selected to be of a lower resistance value than resistor 70, so that when the switching transistor 72 is off, current flows through resistor 68 and the lamp 60 to the neutral return line node 74 causing the green lamp to glow. The red lamp 62 is effectively shunted off.

When the switching transistor 72 is turned on, such as when the ground terminal 24 effective resistance exceeds the predetermined limit, the transistor 72 shorts out or shunts the green lamp 60 and provides a low resistance path from the lamp 62 low voltage side to the return line at node 74. Current thus flows through resistor 70, the red lamp 62 and the transistor 72 thereby causing the red lamp to glow indicating to the user, along with the audible alarm, that the power outlet is unsafe.

In addition to providing the user with an immediate indication that the power outlet is safe or unsafe, the lamp circuit 52 also provides a self test. This is accomplished by the fact that the green light 60 will only glow if in fact power is being received and properly regulated by the circuitry.

Turning now to the wriststrap detector circuit 12, the circuit includes a bandpass filter 74, an amplifier 76, and an open loop comparator 78. The bandpass filter 74 is embodied by an operational amplifier 80 configured to provide a low frequency cutoff at approximately 48 hertz and a high frequency cutoff at approximately 300 hertz. The input terminal 82 of the band pass filter is connected through a manually operable switch 84 to a wriststrap jack 86 that is designed to receive a plug attached to the end of a wriststrap (shown schematically).

Whenever the wriststrap is properly connected to the terminal 86 and is being worn by a user, an AC voltage of approximately 60 hertz will be applied at the node 82 when the switch 84 is closed. This AC voltage is present due to radiated noise from either the power outlet or surrounding electrical equipment, since the human body and the wriststrap act as antennas for this randomly radiated noise. The AC voltage at node 82 is in phase with the neutral return line of the power outlet which is connected to the circuit 12 at node 88.

The bandpass filter circuit 74 is used to filter out most of the noise signal received or picked up through the wriststrap at the node 82 and is specifically designed to permit the 60 cycle signal to pass through to the amplifier 76. When the wriststrap is either not properly connected to the terminal 86 or is not being worn by the user, the 60 cycle component applied or picked up at the node 82 will be substantially reduced in magnitude.

The output of the bandpass filter is connected by conductor 90 to an input of the conventional amplifier 76. The amplifier 76 is designed to have an approximate gain of 100 to 500 depending upon the particular environment where the test circuit will be used. The amplifier 76 improves performance because the radiated signal picked up from the wriststrap and/or the user is typically of very low magnitude and must be amplified in order to be detected.

The AC output of the amplifier 76 is rectified and filtered by a diode 91 and capacitor 92 and the resulting signal is applied to the inverting input 94 of the comparator 78.

The non-inverting input of the comparator 78 is connected to a reference voltage at node 96. The voltage at node 96 is determined by the resistor divider network 98,100, which are two resistors in series between the + DC voltage supply 102 and the neutral return 104.

The diode 91 and capacitor 92 function as a peak voltage detector of the AC output from the amplifier 76. Thus, the voltage at node 94 is an approximate DC voltage having a level that is proportional to the strength of the AC signal being supplied by the user and/or wriststrap at the node 82. Whenever that signal is of sufficient strength, the DC voltage at node 94 is great enough to exceed the reference voltage at node 96 and the comparator 78 output voltage is therefore low or at the minus voltage supply of the operational amplifier. Whenever the DC voltage at the inverting input 94 of the comparator 78 is below the reference voltage at node 96, the comparator 78 output voltage goes high to approximately the + voltage supply for the operational amplifier. The latter condition of course occurs whenever the wriststrap either is not connected to the terminal 86, the wriststrap does not have good continuity, or a user is not wearing the wriststrap, with the result that the 60 cycle signal appearing at node 82 is of insufficient amplitude to provide enough voltage when amplified and detected at the node 94 to trip the comparator 78.

The switch 84 includes a second set of contacts 84a, which connect the comparator 78 output voltage in series with the lamp display circuit 52 and the alarm circuit 50. In this manner, the switch 84a is opened when the switch 84 is opened, thereby disabling the wriststrap detector circuit from the rest of the circuitry shown in FIG. 1. This disconnect function allows the ground monitor circuit to be used independently of the wriststrap circuit, so that a user can test the power outlet wiring prior to connecting the wriststrap and himself to the circuit. Thus, any wiring errors in the outlet can be detected before the wriststrap is actually connected to the plug-in module.

The wriststrap circuit 12 provides an electrostatic ground for the wriststrap through a grounding resistor 106.

When the wriststrap detector circuit 12 is used, the switch 84a is closed and the comparator 78 output activates the lamp display circuit 52 and alarm circuit 50 in a similar manner that the ground integrity circuit 10 activates the output display circuitry. Accordingly, whenever the comparator output 78 is high (thereby indicating for example either that the wriststrap is not connected or that a person is not properly wearing the wriststrap), the switching transistors 56 and 72 are turned on, thus activating the alarm 54 and illuminating the red lamp 62. Whenever the comparator 78 output is low (thereby indicating that the wriststrap is properly connected, has good continuity, and is being worn by the user), the switching transistors 56 and 72 are off, the alarm is off and only the green lamp is energized.

A capacitor 110 is provided to compensate for noise voltage between the ground and neutral terminals. A resistor 112 is provided to discharge this capacitor to minimize reset time after a ground fault is detected.

All of the circuitry shown in FIG. 1 can be conveniently mounted in a small plug-in module such as shown in FIG. 2. The circuitry (shown in phantom in FIG. 2) is interconnected on a small printed circuit board 200 mounted within a plastic housing or case 202. Conventional three-prong plugs (H, N, G) are supported by the case 202 and electrically connected to the corresponding terminals of the circuit as shown in FIG. 1. The lamps 60, 62 are conveniently mounted on the back of the module for easy viewing, and the disable switch 84 is likewise mounted on the back of the module for easy access. The wriststrap plug conveniently inserts into the jack 86.

The operational amplifiers of course are conventional integrated circuits that can be manufactured into very small packages, similarly with the switching transistors, diodes and other components such as the resistors and capacitors. The DC power supplies needed for proper operation of the operational amplifiers are generated within the plug-in module by commercially available voltage regulators that are also integrated circuits and therefore take up very little space within the module. A simple full-wave rectifier is included as a self-contained main power supply 30 within the module to rectify the AC input from the hot and neutral lines. This provides the basic DC power needed for the conventional voltage regulators used to generate the DC power supplies for the operational amplifiers and reference voltages.

The circuitry shown in FIG. 1 also detects the condition of a hot and neutral or ground reversal at the power outlet. This is accomplished by the fact that if hot and neutral are reversed, the effective ground impedance increases because the terminal 24 will no longer be connected directly to true ground but rather will be in series with the transformer impedance back at the power source terminal box (not shown). This impedance typically is well over 2000 ohms and therefore will cause the comparator circuit 22 to trip. Furthermore, if either the hot input line is open or the neutral input line is open, the necessary voltages will not be available to the circuitry in FIG. 1 to permit the green "ok" lamp 60 to glow.

While the invention has been shown and described with respect to a particular embodiment thereof, this is for the purpose of illustration rather than limitation; and other variations and modifications of this specific embodiment herein shown and described will be apparent to those skilled in the art, all within the intended spirit and scope of the invention. Accordingly, the patent is not to be limited in scope and effect to the specific embodiment herein shown and described nor in any other way that is inconsistent with the extent to which the progress in the art has been advanced by the invention.

What is claimed is:

1. A self-contained wriststrap detector circuit comprising:

a housing containing the circuit;

hot, neutral and ground input terminals connected to and extending from said housing for insertion in a power outlet;

means on said housing for removably connecting a wriststrap to said circuit;

an impedance in said housing coupling said wriststrap connecting means to said ground input terminal for developing a predetermined voltage only when a user of the wriststrap is electrostatically grounded and when the housing input terminals are properly connected to said power outlet;

means coupled to said impedance for detecting said predetermined voltage and generating a first output signal representing a safe condition only when said wriststrap is properly connected to said circuit and said user, and a second output signal representing an unsafe condition only when said wriststrap is improperly connected either to said circuit or said user;

indicator means in said housing for indicating the safe and unsafe conditions to said user;

means coupled between said signal generating means and said indicator means for activating the safe and unsafe condition indication in response to said first and second output signals; and a low frequency band pass filter for removing unwanted signals, said band pass filter having an input connected to said wriststrap impedance means and an output coupled to said signal generating means.

2. A wriststrap detector circuit according to claim 1 wherein said bandpass filter has a low frequency cutoff less than 50 hertz.

3. A wriststrap detector circuit according to claim 2 wherein said bandpass filter has a high frequency cutoff less than 1000 hertz.

4. A monitor for testing electrical power outlets comprising:

a plug-in module having a hot input terminal and at least one ground reference input terminal connected to and extending therefrom for insertion in and electrically connectable with corresponding terminals of a power outlet;

means in the plug-in module for generating a low level constant current;

an adjustable resistance in the plug-in module coupling the constant current in series with the ground reference input terminal to cause a threshold voltage level across the adjustable resistance, the voltage level across the adjustable resistance increasing above a reference voltage only when an unsafe ground condition exists;

means in the plug-in module coupled to the adjustable resistance for sensing the voltage across the adjustable resistance and generating an output signal when it exceeds the reference voltage because an unsafe ground condition occurs; and means in the plug-in module responsive to the voltage sensing means output signal for indicating if the unsafe ground condition exists when the plug-in monitor is plugged into the outlet.

5. A ground monitor according to claim 4 wherein said voltage sensing means comprises:
 a voltage comparator having one input connected between said adjustable resistance and said constant current generating means; and
 a second input of said comparator connected to said reference voltage, said comparator generating said output signal only when the voltage across the adjustable resistance exceeds said reference voltage.

6. A ground monitor according to claim 5 wherein said indicating means includes visual and audible alerts and further includes switching transistors which turn on and off in response to said output signals from said voltage comparator to control actuation of said visual and audible alerts.

7. A ground monitor according to claim 6 wherein said comparator produces a first output signal representing said unsafe ground condition when said voltage across said adjustable resistance exceeds said reference voltage set by adjustment of said resistance, and a second output signal representing said safe ground condition when said voltage across said adjustable resistance does not exceed said reference voltage.

8. A self-contained wriststrap detector circuit comprising:
 hot, neutral and ground input terminals connectable to a power outlet;
 means for removably connecting a user wriststrap to said circuit;
 impedance means coupled between said wriststrap connecting means and the neutral input terminal for developing a predetermined a.c. signal voltage only when the user of the wriststrap is electrostatically grounded to the neutral input terminal and the circuit is properly connected to the power outlet;
 means coupled to the impedance means for rectifying the a.c. signal voltage to obtain an input d.c. voltage;
 a d.c. reference voltage;
 a first comparator circuit for receiving the input d.c. voltage and the d.c. reference voltage and generating a first output signal only when the wriststrap is properly connected to both said circuit and to said user and a second output signal when the wriststrap is improperly connected either to said circuit or said user; and
 indicator means coupled to the first comparator circuit for continuously indicating the proper wriststrap connection only when the first output signal is generated and continuously indicating an improper wriststrap connection only when the second output signal is generated.

9. A wriststrap detector circuit according to claim 8 wherein said indicator means further includes means for visually indicating said proper wriststrap connection as a safe condition to the user.

10. A wriststrap detector circuit according to claim 8 wherein said indicator means includes:
 first and second indicator lamp means;
 a switching transistor being connected in series with said first indicator lamp and in parallel with said second indicator lamp; and
 said first comparator circuit first output signal turning the switching transistor off to cause the second lamp to indicate said proper connection and the second output signal of said first comparator circuit turning the switching transistor on to cause the first lamp to indicate said improper wriststrap connection.

11. A wriststrap detector circuit according to claim 10 further comprising a low frequency bandpass noise filter circuit having an input coupled to said wriststrap connecting means and an output coupled to an input of said rectifying means.

12. A wriststrap detector circuit according to claim 11 wherein said bandpass filter has a low frequency cutoff less than 50 hertz.

13. A wriststrap detector circuit according to claim 12 wherein said bandpass filter has a high frequency cutoff less than 1000 hertz.

14. A wriststrap detector circuit according to claim 13 further comprising:
 means for monitoring the effective impedance of the ground terminal when it is connected to the power outlet to detect an unsafe ground condition;
 said monitoring means including a constant current source and an adjustable resistance in series with the constant current source and the ground input terminal to develop a variable voltage across the adjustable resistance;
 a second reference voltage;
 a second comparator circuit comparing the voltage across the adjustable resistance with the second reference voltage and generating an output signal indicative of a safe and unsafe ground condition; and
 said indicator means being responsive to the second comparator circuit output signals to indicate said safe and unsafe ground conditions, respectively.

15. A wriststrap detector circuit according to claim 14 wherein said indicator means includes an audible alarm.

16. A wriststrap detector circuit according to claim 14 wherein said second comparator circuit output signal comprises at least first and second distinct output signals, one of which corresponds to said safe ground condition and the other corresponds to said unsafe ground condition.

17. A wriststrap detector circuit according to claim 16 wherein the indicator means includes first and second lamp means which respectively indicate the safe and unsafe ground conditions, and means coupled to the second comparator circuit for controlling operation of said lamp means in response to said second comparator circuit first and second output signals.

18. A wriststrap detector circuit according to claim 17 wherein said controlling means is a switching transistor connected in parallel with one of said lamp means.

* * * * *